United States Patent
Bang

(10) Patent No.: US 8,310,888 B2
(45) Date of Patent: Nov. 13, 2012

(54) REPAIR FUSE DEVICE

(75) Inventor: Seung In Bang, Icheon (KR); Hyung Seok Bang, legal representative, Seoul (KR); Hyun Koo Choi, legal representative, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 0 days.

(21) Appl. No.: 12/495,562

(22) Filed: Jun. 30, 2009
(Under 37 CFR 1.47)

(65) Prior Publication Data
US 2011/0085396 A1    Apr. 14, 2011

(30) Foreign Application Priority Data

Sep. 9, 2008  (KR) .................. 10-2008-0088766

(51) Int. Cl.
*G11C 7/00*    (2006.01)
(52) U.S. Cl. ........................................ 365/200
(58) Field of Classification Search .................. 365/200, 365/96, 225.7; 327/525
See application file for complete search history.

(56) References Cited

U.S. PATENT DOCUMENTS

| | | | |
|---|---|---|---|
| 7,177,209 B2* | 2/2007 | Choi | 365/200 |
| 2005/0273670 A1* | 12/2005 | Park | 714/43 |
| 2006/0002204 A1* | 1/2006 | Nam et al. | 365/200 |
| 2006/0125548 A1* | 6/2006 | Kitayama et al. | 327/525 |

FOREIGN PATENT DOCUMENTS

| | | |
|---|---|---|
| KR | 1020040061836 A | 7/2004 |
| KR | 1020070074324 A | 7/2004 |
| KR | 1020070101912 A | 10/2007 |

* cited by examiner

*Primary Examiner* — Hoai V Ho
*Assistant Examiner* — Min Huang

(57) ABSTRACT

A repair fuse device is provided. The repair fuse device remarkably reduces the number of the enable fuse cuttings by making initial states of all repair fuse sets to a repair state, cutting an address fuse corresponding to a defective cell, and cutting an enable fuse corresponding to a defective redundancy cell.

10 Claims, 2 Drawing Sheets

REPAIR FUSE DEVICE

CROSS-REFERENCE TO RELATED APPLICATION

The priority of Korean patent application No. 10-2008-0088766 filed on Sep. 9, 2008, the disclosure of which is hereby incorporated in its entirety by reference, is claimed.

BACKGROUND OF THE INVENTION

The present invention relates to a repair fuse device.

Semiconductor memory device includes numerous fine memory cells and logic circuits to drive the fine memory cells. Hence, the fabrication of semiconductor memory devices requires a large number of processes. Defects inevitably occur while such processes are performed. If a defect occurs in any one of the memory cells, the corresponding semiconductor memory device cannot operate normally. However, it is inefficient to discard the entire semiconductor memory device for defects in only several of its memory cells.

Therefore, a repair method is employed for most semiconductor memory devices, in which redundancy cells are formed within a memory to replace defective cells when defects occur in some of the main memory cells.

In such a method using redundancy cells, the replacement of defective cells is performed by cutting fuses corresponding to addresses of the defective cells and cutting enable fuses indicating the use of corresponding repair fuse sets. That is, the defective cells are repaired not when the fuses corresponding to the addresses of the defective cells are cut, but when the enable fuses are cut. Thus, the cutting of the enable fuses is performed for each repair.

As such, the cutting of the enable fuses must be performed as many times as the number of required repairs. As a result, when one wafer is repaired, the cutting of the enable fuses is performed several tens of thousands to several hundreds of thousands of times. Also, as the more repairing process is required, the more probability of repair failure exist. Therefore, increased number of fuse cutting job lowers production yield.

BRIEF SUMMARY OF THE INVENTION

According to an embodiment of the present invention, a repair fuse device includes: a repair fuse unit including an address fuse to be cut in correspondence with a defective main cell and an enable fuse to be cut in correspondence with a defective redundancy cell, the repair fuse unit being configured to output a first selection signal corresponding to the cutting of the address fuse and a second selection signal corresponding to the cutting of the enable fuse; and a repair unit configured to repair the defective main cell and normal main cells with normal redundancy cells according to an applied address, the first selection signal, the second selection signal and preset matching information.

In this manner, the normal main cells as well as the defective main cell are repaired by using all the normal redundancy cells, and the role of the enable fuse is changed. Thus, the number of the enable fuse cuttings is remarkably reduced, thereby lowering the probability of the cutting failure.

When the first selection signal and the second selection signal are not activated, the repair unit repairs the normal main cells with the redundancy cells according to the matching information.

When the first selection signal is activated, the repair unit repairs the defective main cell corresponding to the first selection signal with the redundancy cell. When only the first selection signal of the first and second selection signals is activated, the repair unit repairs the preset (or predetermined number of) normal main cells with the remaining redundancy cells other than the redundancy cell used to repair the defective main cell according to the matching information. At this point, the preset normal main cells are normal main cells corresponding to the remaining redundancy cells other than the redundancy cell used to repair the defective main cell in the initial matching information.

When the second selection signal is activated, the repair unit repairs the defective main cell and the normal main cells with the remaining redundancy cells other than the defective redundancy cell corresponding to the second selection signal. When only the second selection signal of the first and second selection signals is activated, the repair unit repairs the preset normal main cells with the remaining redundancy cells other than the defective redundancy cell corresponding to the second selection signal. When the first and second selection signals are activated, the repair unit repairs the defective main cell using a specific redundancy cells and repairs the normal main cells using the remaining redundancy cells other than the specific redundancy cell.

The enable fuse is cut in 1:1 correspondence with the defective redundancy cell.

DESCRIPTION OF EMBODIMENTS

Figure 1:
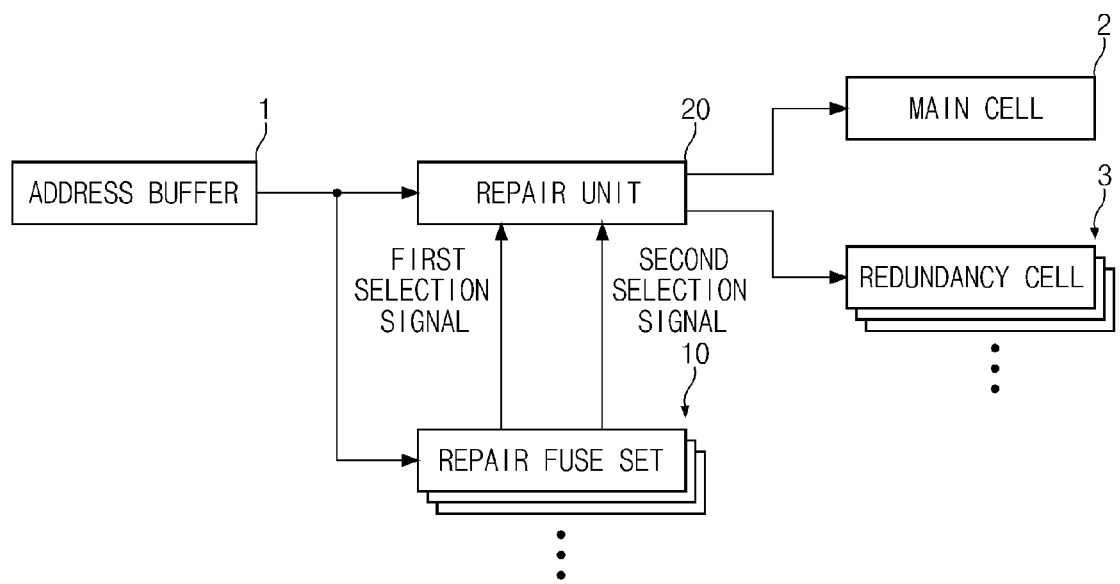
FIG. 1 is a block diagram illustrating a repair fuse device according to an embodiment of the present invention.

FIG. 1 is a block diagram illustrating a repair fuse device according to an embodiment of the present invention.

Referring to FIG. 1, the repair fuse device according to the embodiment of the present invention includes a repair fuse unit 10 and a repair unit 20.

The repair fuse unit 10 includes a plurality of repair fuse sets. Each of the repair fuse sets includes an address fuse and an enable fuse. The address fuse is cut in correspondence with an address of a defective main cell, and the enable fuse is cut in accordance with an address of a defective redundancy cell. Each of the repair fuse sets generates a first selection signal corresponding to the cutting of the address fuse and a second selection signal corresponding to the cutting of the enable fuse, and outputs the first selection signal and the second selection signals to the repair unit 20. Specifically, if the address fuse is cut in correspondence with the address of the defective main cell, the repair fuse set outputs the first selection signal to the repair unit 20 when an address of a corresponding defective cell is received from an address buffer 1. Among the repair fuse sets, the specific repair fuse set in which the enable fuse is cut outputs the second selection signal to the repair unit 20.

The repair unit 20 repairs defective main cells and preset normal main cells with redundancy cells according to addresses received from the address buffer 1, the selection signals received from the repair fuse unit 10, and preset matching information. That is, the repair unit 20 is configured to repair some normal main cells as well as the defective main cells by using all the redundancy cells 3 other than defective redundancy cells.

The repair unit 20 has matching information to match some preset normal main cells with the redundancy cells. Therefore, when all of the main cells and the redundancy cells are not defective, the repair unit 20 repairs the preset normal main cells with the redundancy cells according to the matching information. That is, all the redundancy cells are used to repair the normal main cells.

However, when a test result shows that the defective main cells exist, some of the redundancy cells are used to repair the defective main cells in a predetermined order, and the remaining redundancy cells are used to repair the normal main cells. Hence, when the defective main cells exist, the matching information is modified not to repair the normal main cells that have corresponded to the redundancy cells used for repairing the defective main cells. Moreover, in the above-described cases, when the defective redundancy cells exist, the matching information is modified not to repair the normal main cells that have corresponded to the defective redundancy cell. That is, when the second selection signal is outputted from the repair fuse set corresponding to the defective redundancy cell, the repair unit 20 does not repair the normal main cell or the defective main cell with the corresponding redundancy cell.

Figure 2:
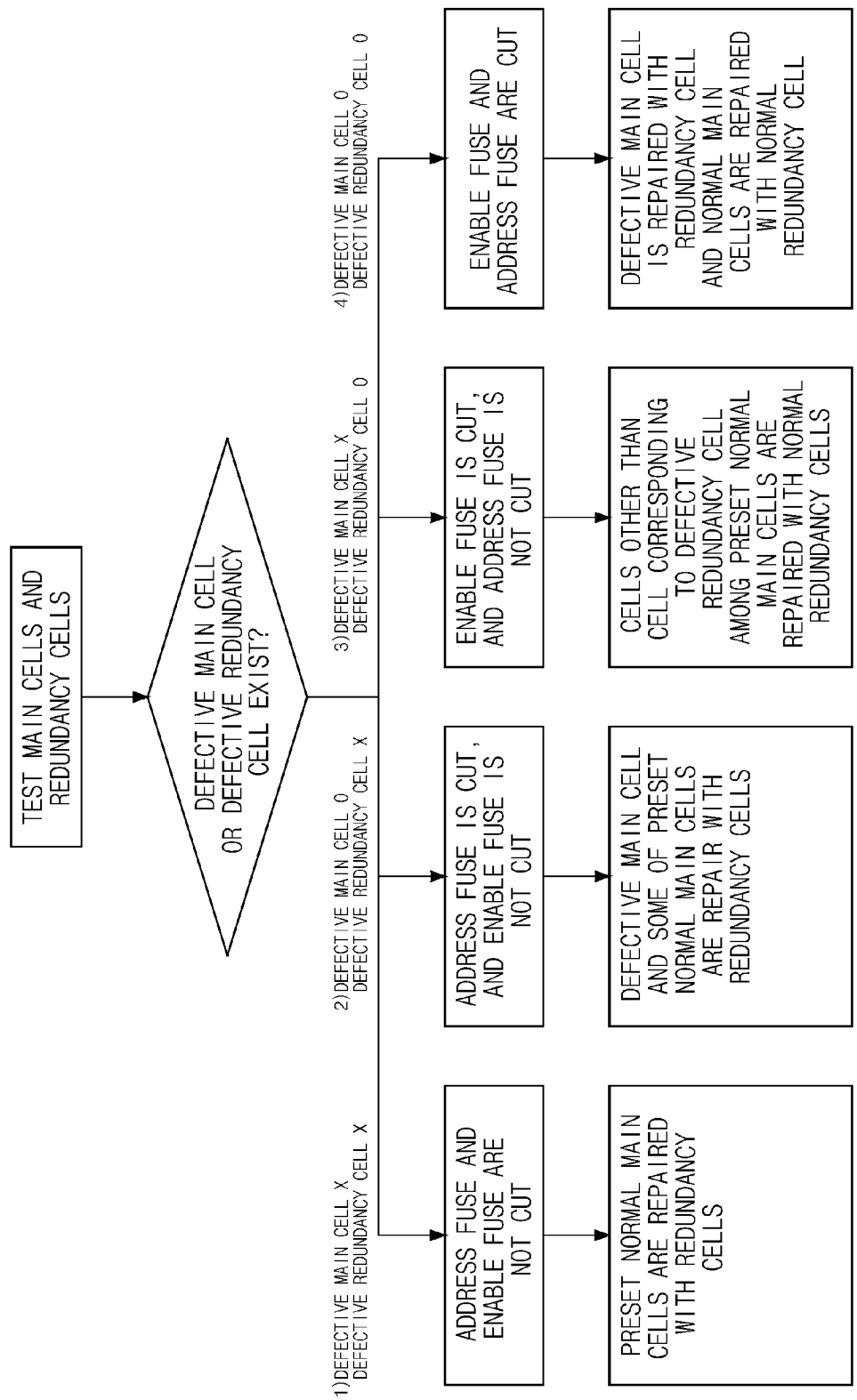
FIG. 2 is a flowchart illustrating a fuse cutting and a repair operation in the repair fuse device according to the embodiment of the present invention.

FIG. 2 is a flowchart illustrating a fuse cutting and a repair operation in the repair fuse device according to the embodiment of the present invention.

The operation of the repair fuse device according to an embodiment of the present invention will be described below in more detail with reference to FIG. 2.

First, by separately testing the main cells 2 and the redundancy cells 3 in a test mode, it is determined whether a defective main cell and a defective redundancy cell exist or not.

The test result may have the following cases: 1) a case where no defective main cell and no defective redundancy cell exist; 2) a case where the defective main cell exists but no defective redundancy cell exists; 3) a case where the defective redundancy cell exists but no defective main cell exists; and 4) a case where both the defective main cell and the defective redundancy cell exist.

1) The first case where no defective main cell and no defective redundancy cell exist.

In this case, neither address fuse nor enable fuse of the repair fuse sets is cut.

Thus, the repair fuse unit 10 activates neither the first selection signal nor the second selection signal even though addresses are received from the address buffer 1.

The repair unit 20 repairs normal main cells using all of the redundancy cells 3 according to the matching information and the addresses received from the address buffer 1.

2) The second case where a defective main cell exists but no defective redundancy cell exists.

In this case, an address fuse of a specific repair fuse set corresponding to the address of the defective main cell is cut. However, the enable fuse of the respective repair fuse set is not cut.

Thus, the repair fuse unit 10 outputs only the first selection signal, which is activated in the corresponding repair fuse set, to the repair unit 20.

The repair unit 20 repairs the defective main cell of the corresponding address using a specific redundancy cell according to the address received from the address buffer 1 and the first selection signal outputted from the repair fuse unit 10. The repair unit 20 repairs the normal main cells using the remaining redundancy cells according to the matching information in the same manner as the above-described first case. That is, the repair unit 20 repairs the normal main cells with all the redundancy cells other than the specific redundancy cell, which is used to repair the defective main cell, according to the matching information.

In this case, the matching information of the repair unit 20 is modified not to repair the normal main cell with the specific redundancy cell used to repair the defective main cell. Therefore, the repair unit 20 does not repair the normal main cell, which corresponds to the specific redundancy cell used to repair the defective main cell in the matching information of the above-described first case, with the redundancy cell.

That is, due to the modification of the matching information, the corresponding normal main cell is excluded from the redundancy target, and thus, data is read or written to the corresponding main cell when the address of the corresponding main cell is received from the address buffer 1.

3) The third case where only the defective redundancy cell exists

In this case, an enable fuse of a repair fuse set corresponding to the defective redundancy cell is cut. However, address fuse of the respective repair fuse set is not cut.

Thus, the repair fuse unit 10 outputs only the second selection signal, which is activated in the corresponding repair fuse set, to the repair unit 20.

The repair unit 20 does not repair only the corresponding main cell (the normal main cell set corresponding to the defective redundancy cell in the initial matching information) according to the address received from the address buffer 1, the second selection signal and the matching information, and repairs the remaining preset normal main cells with the redundancy cells in the same manner as the above-described first case.

4) The fourth case where both a defective main cell and a defective redundancy cell exist In this case, an address fuse of a repair fuse set corresponding to the address of the defective main cell is cut, and an enable fuse of a repair fuse set corresponding to the defective redundancy cell is cut.

Thus, the repair fuse unit 10 outputs the first selection signal and the second selection signal, which are respectively activated in the corresponding repair fuse sets, to the repair unit 20.

The repair unit 20 repairs the defective main cell using a specific redundancy cell according to the address received from the address buffer 1, the first selection signal and the second selection signal, and repairs the normal main cells using the remaining redundancy cells other than the specific redundancy cell, which is used to repair the defective main cell, and the defective redundancy cell according to the matching information. That is, the repair unit 20 repairs the defective main cell and some normal main cells using the normal redundancy cells in the same manner as the above-described third case.

According to the present invention, as described above, after the initial states of all the repair fuse sets are made to a repair state, the address fuse corresponding to the defective main cell is cut in the same manner as the conventional art, and the enable fuse corresponding to the defective redundancy cell is cut. In this way, all the redundancy cells other than the defective redundancy cell are used to repair the defective main cell or the normal main cells.

According to the present invention, process steps and time to cut a number of the enable fuses can be saved significantly, compared with the conventional art, by cutting the enable fuse corresponding to only the defective redundancy cell. This is because the probability that defects will occur in the redundancy cells is much lower than the probability that defects will occur in the main cells.

Therefore, the yield of the semiconductor memory device can be improved by lowering the probability of the fuse cutting failure that may occur during the fuse cutting.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A repair fuse device comprising:
a repair fuse unit including an address fuse to be cut in correspondence with a defective main cell and an enable fuse to be cut in correspondence with a defective redundancy cell, the repair fuse unit being configured to output a first selection signal corresponding to the cutting of the address fuse and a second selection signal corresponding to the cutting of the enable fuse; and
a repair unit configured to repair a first main column including the defective main cell and a second main column that does not include the defective main cell using all normal redundancy cells according to a received address, the first selection signal, the second selection signal, and matching information.

2. The repair fuse device according to claim 1, wherein, when the first selection signal and the second selection signal are not activated, the repair unit is configured to repair the second main column using the redundancy cells according to the matching information.

3. The repair fuse device according to claim 1, wherein, when the first selection signal is activated, the repair unit is configured to repair the first main column corresponding to the first selection signal using the redundancy cell.

4. The repair fuse device according to claim 3, wherein, when only the first selection signal of the first and second selection signals is activated, the repair unit is configured to repair a preset second main column using the remaining redundancy cells.

5. The repair fuse device according to claim 4, wherein the preset second main column has normal main cells corresponding to the remaining redundancy cells other than the redundancy cell used to repair the first main column according to the initial matching information.

6. The repair fuse device according to claim 1, wherein, when the second selection signal is activated, the repair unit repairs the first main column and the second main column using remaining redundancy cells other than the defective redundancy cell corresponding to the second selection signal.

7. The repair fuse device according to claim 6, wherein, when only the second selection signal of the first and second selection signals is activated, the repair unit is configured to repair the preset second main column using the remaining redundancy cells.

8. The repair fuse device according to claim 6, wherein, when the first and second selection signals are activated, the repair unit is configured to repair the first main column using a specific redundancy cell and repair the second main column using the remaining redundancy cells other than the specific redundancy cell.

9. The repair fuse device according to claim 6, wherein, when only the second selection signal of the first and second selection signals is activated, the repair unit is configured to repair the preset second main column with the remaining redundancy cells.

10. The repair fuse device according to claim 1, wherein the enable fuse is cut in 1:1 correspondence with the first main column.

* * * * *